United States Patent
Schmid et al.

(10) Patent No.: US 6,559,523 B2
(45) Date of Patent: May 6, 2003

(54) DEVICE FOR ATTACHING A SEMICONDUCTOR CHIP TO A CHIP CARRIER

(75) Inventors: Hermann Schmid, Schwaig (DE); Wolfgang Ramin, Freising (DE); Nusret Yilmaz, Freising (DE); Heinrich Brenninger, Kranzberg (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/838,053

(22) Filed: Apr. 19, 2001

(65) Prior Publication Data

US 2002/0153598 A1 Oct. 24, 2002

(30) Foreign Application Priority Data

Apr. 19, 2000 (DE) .......................................... 100 19 443

(51) Int. Cl.$^7$ ............................................. H01L 23/495
(52) U.S. Cl. .................... 257/673; 438/108; 156/332
(58) Field of Search ................ 257/673, 778; 438/108; 156/332

(56) References Cited

U.S. PATENT DOCUMENTS

| | | | | |
|---|---|---|---|---|
| 5,115,545 A | * | 5/1992 | Fujimoto et al. | .......... 29/25.01 |
| 5,508,796 A | | 4/1996 | Sasame et al. | |
| 5,778,294 A | * | 7/1998 | Hiraoka et al. | ............. 399/329 |
| 6,077,382 A | * | 6/2000 | Watanabe | .................. 156/322 |
| 6,269,999 B1 | * | 8/2001 | Okazaki et al. | ............. 228/106 |

* cited by examiner

Primary Examiner—Nathan J. Flynn
Assistant Examiner—Leonardo Andújar
(74) Attorney, Agent, or Firm—Wade James Brady, III; Frederick J. Telecky, Jr.

(57) ABSTRACT

In a device for attaching a semiconductor chip (10) to a chip carrier (12), thereby producing an electrically conducting connection between contact areas (22, 24) arranged on a surface of the semiconductor chip (10) and contact areas (26, 28) on the chip carrier (12) by means of an anisotropically conducting film (16) or an anisotropically conducting paste (16), a pressure die (18) is used for the application of the pressure to the chip (10) with an adjustable pressing force against the chip carrier (12). A counter-pressure support (14) accepts the chip carrier (12) with the semiconductor chip (10) arranged on it with the interposition of the anisotropically conducting film (16) or the anisotropically conducting paste (16). An elastic body (20) is arranged either between the pressure die (14) and the semiconductor chip (10) or between the chip carrier (12) and the counter-pressure support (14).

16 Claims, 1 Drawing Sheet

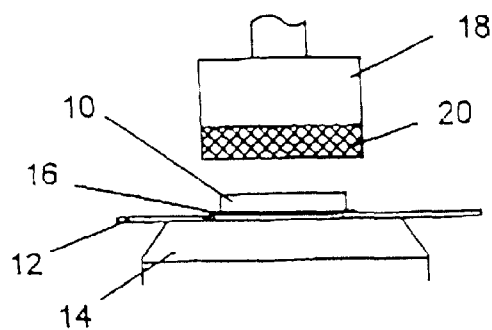
Fig.1
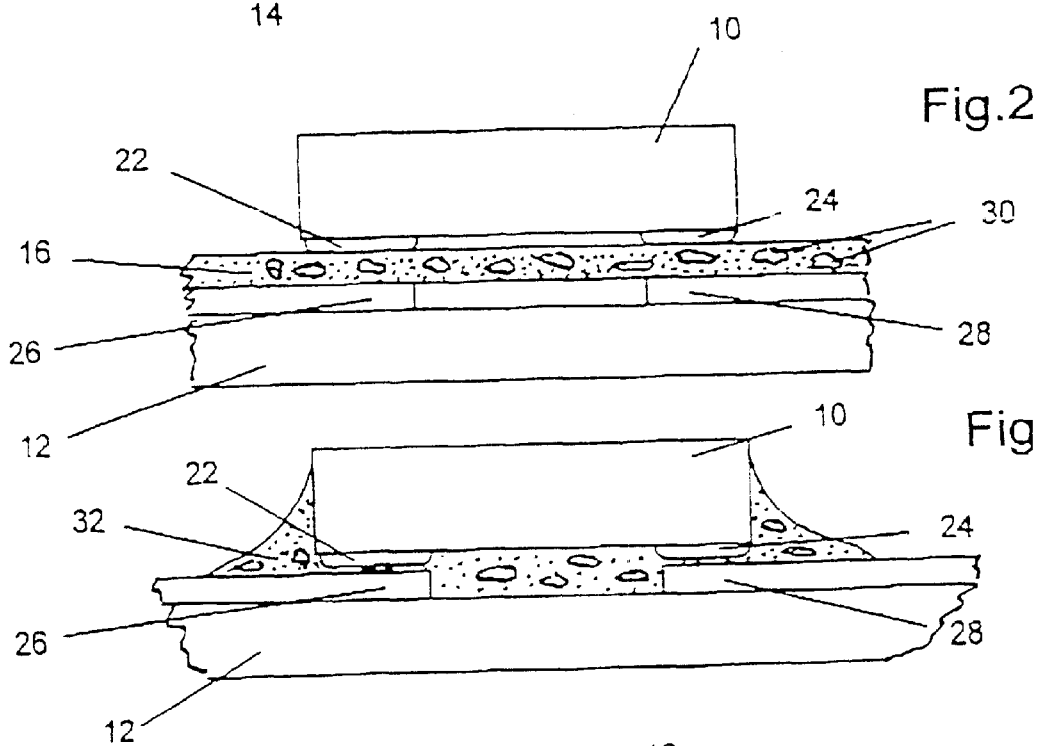
Fig.2
Fig.3
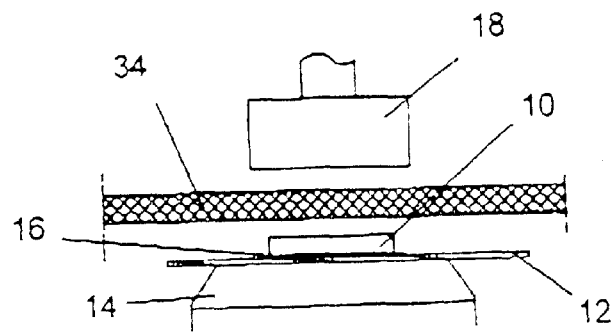
Fig.4
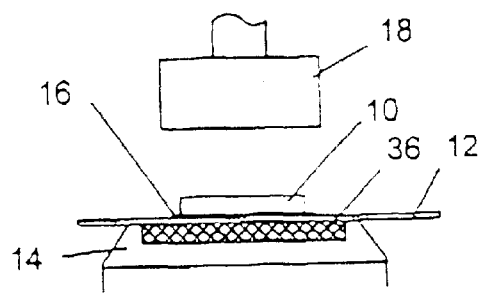
Fig.5

DEVICE FOR ATTACHING A SEMICONDUCTOR CHIP TO A CHIP CARRIER

The invention relates to a device for attaching a semiconductor chip to a chip carrier, thereby producing an electrically conducting connection between contact areas arranged on a surface of the semiconductor chip and contact areas on the chip carrier by means of an anisotropically conducting film or an anisotropically conducting paste.

In the production of electronic parts, use is more and more frequently made of a new process for producing the electrical connection between a semiconductor chip and the contact areas on a carrier, connected by conductor tracks, whereby the contact areas of the semiconductor chip are brought into direct contact with the contact areas of the carrier. The previously used package, housing the semiconductor chip, and which was provided with its own contact areas used for contact bonding, is hereby dispensed with. To produce the electrical connection between the contact areas of the semiconductor chip and the contact areas on the carrier, use is thereby made of an anisotropically conducting film or an anisotropically conducting paste, that is a material which offers a very low electric resistance in only one direction, whilst it is practically non-conducting in the direction perpendicular to it.

A problem when using such a film or such a paste to produce the electrical connection between the contact areas of the semiconductor chip and the contact areas of the carrier is that very narrow tolerances must be adhered to as regards the tools which are used to press the semiconductor chip against the film or the paste and the carrier, since a reliable electrical connection between the different contact areas of the semiconductor chip and the corresponding contact areas on the carrier can only be achieved when, on the one hand, the pressure applied is evenly distributed and, on the other, the thickness of the film or the paste between the areas in contact with each other is made as uniform as possible. The uniformity of the layer thickness is of great importance for the following reason. The anisotropic conduction behaviour of the film or of the paste used is achieved in that in a material, such as epoxy resin, electrically conductive particles are embedded which are not in contact with each other. In the direction of the surface extension of the film or the paste, respectively, this material therefore offers a very high electric resistance, but it assumes a low-resistance state when as a result of applied pressure it becomes so thin between two contact areas that the particles embedded in the epoxy resin come into contact with both the contact areas at the semiconductor chip and also with the contact areas at the carrier. These particles then produce a conducting connection between the contact areas. If, however, the semiconductor chip is pressed against the carrier in even a slightly slanting position, because of excessive tolerances, a situation may arise where the conducting particles cannot produce a conducting connection between the contact surfaces because they are not in contact with each other, and that the film or paste material is squeezed out at some contact areas to an extent that no conducting particles remain available between the contact areas to be connected. The desired electrical connection between the contact areas is therefore not realised at these points, so that the unit to be produced has to be scrapped. Especially in the case of semiconductor chips having a plurality of contact areas which are to be connected to the corresponding contact areas of the carrier, this requirement for a uniform contact pressure constitutes a problem that is difficult to solve.

The invention rests of the requirement to produce an embodiment of the device of the type described in the foregoing that will allow the desired electrical connections between the contact areas on the semiconductor chip and the corresponding contact areas on the chip carrier to be realised in a highly reliable way, without the need for stringent demands on the tolerance of the parts involved.

This requirement is satisfied according to the invention in the device described above by a pressure die for the application of pressure to the chip with an adjustable pressing force against the chip carrier, a counter-pressure support for receiving the chip carrier with the semiconductor chip arranged on it with the interposition of the anisotropically conducting film or the anisotropically conducting paste, and an elastic body arranged either between the pressure die and the semiconductor chip or between the chip carrier and the counter-pressure support.

The elastic body used in the device according to the invention takes care of the compensation of tolerances and ensures that the semiconductor chip is pressed in precisely plane-parallel alignment against the chip carrier, so that between the contact areas on the semiconductor chip and the corresponding contact areas on the chip carrier equal distances are obtained, which are essential for the establishment of reliable electrical connections between these contact areas.

In an advantageous embodiment, the elastic body can be attached to the face of the pressure die, or else to the surface of the counter-pressure support which receives the chip carrier. The elastic body can advantageously also be an elastic strip extending between the face of the pressure die and the surface of the chip. To accelerate the solidification of the electrical connection produced, the counter-pressure support may be heated to enable the anisotropically conducting film used or the anisotropically conducting paste used to set hard in a shorter time. The elastic body may advantageously be made of heat-resistant silicone.

The invention shall now be described in exemplified form with reference to the drawing, where FIG. 1 shows a first embodiment of the device according to the invention, FIG. 2 is an enlarged section of the device of FIG. 1, before the semiconductor chip is pressed against the chip carrier by means of the pressure die, FIG. 3 is an enlarged section of FIG. 2 after pressure-bonding the semiconductor chip, FIG. 4 shows the device according to the invention in a second embodiment, and FIG. 5 shows the device according to the invention in a third embodiment.

By reference to the device schematically represented in FIG. 1, a semiconductor chip 10 is to be attached to a chip carrier 12 in such a way that the contact areas located on the lower surface of the semiconductor chip, facing the chip carrier 12, are to be brought into electrical contact with the contact areas located on the upper surface of the chip carrier 12, facing the semiconductor chip 10. The chip carrier 12 can have printed circuit paths on its upper surface, whereby specific areas of these circuit paths constitute the contact areas which are to be connected to the corresponding contact areas of the semiconductor chip. The chip carrier 12 can, for example, be a ceramic substrate, a conventional circuit board, or even a foil printed with circuit paths. In the example described it is assumed that the chip carrier is such a foil with printed circuit paths.

The chip carrier 12 is placed on a counter pressure support 14 and a piece of an anisotropically conducting film 16 is placed on its top side, in the area where the semiconductor chip 10 is to be attached. This film, also known as ACF (for anisotropic conductive film), consists of epoxy resin in which the electrically conducting particles are embedded. Such films are commercially available from Toshiba and Hitachi.

The semiconductor chip 10 is then placed on the film 16 in such a way that the contact areas at its bottom surface come to rest exactly over the chip carrier contact areas with which electric contact is to be made. A pressure die 18 is subsequently lowered onto the top side of the semiconductor chip 10 with a pre-determined, precisely defined force. On the face of this pressure die 18 there is an elastic body 20 of silicone which ensures that the semiconductor chip 10 is pressed against the chip carrier 12 in precise plane-parallel alignment with respect to the surface of the counter pressure support 14. Because of the elasticity of the elastic body 20, any incorrect alignment or any tolerances of the parts moving together, in relation to each other, are thus compensated.

FIG. 2 shows in an enlarged sectional view, not to scale, how the contact areas 22, 24 at the bottom surface of the semiconductor chip 10 are positioned in relation to the contact areas 26, 28 on the chip carrier 12 when the semiconductor chip 10 is in place, after the interposition of the film 16 and before the application of pressure by the pressure die 18. As can be seen, the film 16 contains electrically conducting particles 30 which are not in contact with respect to each other, so that the film has a very high electric resistance. Only when, after application of pressure, the film becomes so thin as is shown in FIG. 3, the electrically conducting particles establish a connection between the contact areas 22, 26 and 24, 28, respectively. The electric resistance in the direction parallel to the surface expansion of the film, however, still remains high, so that no short circuit can occur between the contact areas separated from each other in this direction.

As shown in FIG. 3, the application of pressure to the top side of the semiconductor chip 10 causes all interstices between the contact areas to be completely filled with the material of the film. Since the elastic body 20, on application of pressure, also folds around the edges of the semiconductor chip 10, an accumulation 32 of the material of the film 16 is produced around the entire semiconductor chip 10, which not only perfectly protects the chip against external influences, but also from separation, even when the chip carrier 12 is subjected to bending stresses.

A further embodiment variant of the here described device is represented in FIG. 4, where the elastic body is not applied to the face of the pressure die 18, but takes the shape of an elastic strip 34 which extends between the face of the pressure die 18 and the surface of the semiconductor chip 10. When the pressure die 18 in lowered in the direction of the semiconductor chip 10, the elastic band 34 is applied, in the same manner as the elastic body 20 in the embodiment shown in FIG. 1, to and around the semiconductor chip 10, thus producing the same effect as the elastic body 20.

The embodiment of the device represented in FIG. 5 differs from the previously described embodiments in that the elastic body is in the form of an elastic padding 36, inset in the surface of the counter pressure support 14, which, just like the elastic bodies described as part of previous embodiments, is able to compensate for any unevenness when a pressure is exerted on the semiconductor chip 10.

The anisotropically conducting film 16 in the embodiments described can also be replaced by an anisotropically conducting paste which, like the film, consists of an epoxy resin in which conducting particles are embedded. Such pastes are commercially available, for example from the companies previously mentioned. They are also known by their shortened designation of ACP (for Anisotropic Conductive Paste).

For the purpose of accelerating the hardening process of the film or the paste, all embodiments described can be provided with a heated counter pressure support 14. The consequence of this is that a durable connection between the semiconductor chip 10 and the chip carrier 12 is achieved in only a short time.

By the use of the device described, very reliable connections between the contact areas of the semiconductor chip and the corresponding contact areas on the chip carrier 12 can be achieved, which also applies when a large number of contact areas is present on the underside of the semiconductor chip 10, that are to be connected to the corresponding contact areas of the chip carrier 14.

What is claimed is:

1. Device for attaching a semiconductor chip to a chip carrier to produce an electrically conducting connection between contact areas arranged on a surface of the semiconductor chip and contact areas on the chip carrier by means of an anisotropically conducting medium electrical conductor comprising:

a chip carrier carrying thereon a semiconductor chip, an adjustable pressure die for the application of pressure to the semiconductor chip with an adjustable pressing force against the chip carrier, a counter-pressure support for receiving the chip carrier with the semiconductor chip arranged thereon, an anisotropically conducting medium disposed on said chip carrier, and an elastic body disposed between the pressure die and the semiconductor chip for creating an accumulation of anisotropically conducting medium over the sides of the semiconductor chip and on surface regions of the semiconductor chip having contact areas.

2. Device according to claim 1, the elastic body being fitted to the face of the pressure die.

3. Device according to claim 2 wherein the elastic body comprises heat-resistant silicone.

4. Device according to claim 1, wherein the elastic body is a band extending parallel to and between the face of the pressure die and the surface of the semiconductor chip.

5. Device according to claim 4 wherein the counter-pressure support is heated.

6. Device according to claim 4 wherein the elastic body comprises heat-resistant silicone.

7. Device according to claim 1 wherein the counter-pressure support is heated.

8. Device according to claim 7 wherein the elastic body comprises heat-resistant silicone.

9. Device according to claim 1 wherein the elastic body comprises heat-resistant silicone.

10. Device according to claim 2 wherein the counter-pressure support is heated.

11. Device for attaching a semiconductor chip to a carrier comprising:

a chip carrier carrying a semiconductor chip thereon;

a pressure die for the application of pressure to the chip with an adjustable pressing force against the chip carrier, a counter-pressure support for receiving the chip carrier with the semiconductor chip arranged thereon, an anisotropically conducting medium interposed between said chip and said counter-pressure support, and an elastic body disposed between the pressure die and the semiconductor chip.

12. Device according to claim 11, wherein the elastic body is fitted to the face of pressure die.

13. Device according to claim 12 wherein the counter-pressure support is heated.

14. Device according to claim 12 wherein the elastic body comprises silicone.

15. Device according to claim 11 wherein the counter-pressure support is heated.

16. Device according to claim 11 wherein the elastic body comprises silicone.

* * * * *